(12) United States Patent
Ryu

(10) Patent No.: US 6,800,550 B2
(45) Date of Patent: Oct. 5, 2004

(54) METHOD FOR FORMING T-SHAPED CONDUCTIVE WIRES OF SEMICONDUCTOR DEVICE UTILIZING NOTCHING PHENOMENON

(75) Inventor: Sang Wook Ryu, Chungcheongbuk-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/265,616

(22) Filed: Oct. 8, 2002

(65) Prior Publication Data

US 2003/0077894 A1 Apr. 24, 2003

(30) Foreign Application Priority Data

Oct. 23, 2001 (KR) ..................................... 2001-0065456

(51) Int. Cl.[7] .......................................... H01L 21/4763
(52) U.S. Cl. ...................... 438/637; 438/638; 438/622; 438/647
(58) Field of Search ................................ 438/637, 638, 438/640, 622, 626, 627, 647

(56) References Cited

U.S. PATENT DOCUMENTS 6,528,363 B2 * 3/2003 Ku et al. .................... 438/197

FOREIGN PATENT DOCUMENTS

KR  1992-0013606  7/1992

OTHER PUBLICATIONS

Notice of Preliminary Rejection from the Korean Intellectual Property Office dated Jun. 30, 2003 (2 pages), with English translation (2 pages).

* cited by examiner

Primary Examiner—Jack Chen
(74) Attorney, Agent, or Firm—Finnegan, Henderson, Farabow, Garrett & Dunner, L.L.P.

(57) ABSTRACT

A method is provided for forming a conductive wire of a semiconductor device using, for example, a damascene process. A conductive wire, such as a metal wire, is formed, based on a notching phenomenon which occurs when the etching selectivity between a polycrystalline silicon layer and a lower film is approximately 5 to 500:1.

12 Claims, 6 Drawing Sheets

METHOD FOR FORMING T-SHAPED CONDUCTIVE WIRES OF SEMICONDUCTOR DEVICE UTILIZING NOTCHING PHENOMENON

BACKGROUND OF THE INVENTION

1. Field of the Invention

The present invention relates to a method for forming conductive wires of a semiconductor device, more particularly, to a method for forming conductive wires of a semiconductor device by utilizing a notching phenomenon of polycrystalline silicon.

2. Description of the Related Art

Semiconductor fabrication techniques attempt to attain high integration and high performance. Copper wiring is commonly used in the fabrication of semiconductor devices.

However, copper wires are difficult to etch using conventional etching materials. Due to this characteristic of copper wires, a damascene process is typically used in which an interlayer dielectric film is etched to form a trench, a copper layer is deposited to fill the trench, and the copper layer is then planarized.

There are various known methods for forming copper wires using the damascene process. For example, in one known process a trench is formed for the copper wire, and a via/contact hole is magnetically aligned.

Unfortunately, known methods have problems with lithography overlays, especially in semiconductor devices utilizing a design rule 0.13 µm. Using a design rule of 0.13 µm or below often results in misalignment of via/contact holes of up to 0.01 µm. It is difficult to control misalignment under 0.03 µm, especially using a stepper. The limit for misalignment for thickness uniformity of disposed layers and status of the stepper in a semiconductor device fabrication process is often greater than 0.07 µm. Thus, conventional damascene processes must be performed with many restrictions. In addition, the stepper itself has limits on overlays, since misalignment of the hole and the trench often occurs.

FIG. 1a is a cross sectional view illustrating a conventional process for forming a via/contact hole after forming a trench. First, a lower structure is formed at an upper portion of a semiconductor substrate 11. A first interlayer dielectric film 13 is formed on the whole surface of substrate 11. A lower metal wire mask, which exposes portions of substrate 11 for the lower metal wire, is used as an etching mask for etching the first interlayer dielectric film 13 to form a trench. A metal layer for wiring the lower metal is then formed on the surface of dielectric file 13 and an exposed portion of substrate 11. For example, a copper film may be used for the metal layer as a lower metal wire. The metal layer then undergoes a chemical mechanical polishing ("CMP") process to form the lower metal wire 15.

A diffusion barrier layer 17 is formed on the whole surface having a predetermined thickness. The diffusion barrier layer 17 is typically a $Si_3N_4$ or SiC film. A second interlayer dielectric film 19 is then formed on top of the diffusion barrier layer 17.

An upper metal wire mask, which exposes portions for the upper metal wire, is used as the etching mask for etching the second interlayer dielectric film 19 based on a designated thickness and form a trench 23. A photoresist film pattern 21 is formed on the surface of the second interlayer dielectric film 19 to expose a location for the via/contact hole. However, because of misalignment, the photoresist film pattern 21 may be formed such that an upper portion of dielectric film 19 is exposed also.

FIG. 1b is a cross sectional view showing another conventional process of forming a via/contact hole after forming a trench. The same steps explained in FIG. 1a are repeated up to formation of the second interlayer dielectric film 19. Then, a via/contact mask is used as an etching mask for etching the second interlayer dielectric film 19 and form a via/contact hole 25. In addition, a photoresist film pattern 21 is formed on the second interlayer dielectric film 19 to expose portions for the upper metal wire. Occasionally, the lower metal wire 15 is not exposed, especially when the photoresist film pattern 21 is embedded into the via/contact hole 25, and the diffusion barrier layer 17 is not properly removed.

FIGS. 2a through 2c show the problems with the conventional processes for forming conductive wires in semiconductor devices. FIG. 2a shows the problems of using $N_2$ or $NH_3$ to remove the photoresist film pattern after the via/contact hole is formed. In particular, FIG. 2a shows a poisoning phenomenon in which acidic $H^+$ is produced in the exposed region of the photoresist film. During the process of forming the photoresist film pattern for the trench mask, acidic $H^+$ may produced because of a reaction with an alkaline developing solution that is not properly dissolved or failed to become water ($H_2O$). Instead, other remaining acidic ions in the via/contact hole, such as, $NH_+$, $NH_2^+$, or $NH_3^+$, may cause the $H^+$ to remain undissolved and result in photoresist film in the shape of a mushroom.

FIG. 2b shows a dry etching process for forming the via/contact hole and the trench where no etching stop film is used in order to decrease parasitic permittivity between metal wires. As shown, the edge of the upper portion of the via/contact hole is collapsed due to a facet phenomenon, which is typically observed in the dry etching process.

FIG. 2c shows a trench etching process using the photoresist film pattern and embedding a part of the via/contact hole. As shown, a narrow gap between the via/contact hole and the trench causes etching byproducts that are produced by the trench etching process of the interlayer dielectric film to fill in the via/contact hole, and to attach to the photoresist film.

As explained above, traditional methods for forming conductive wires in semiconductor devices often cause misalignments during formation of the trench and the via/contact hole, and exhibits the problems shown in FIGS. 2a through 2c, i.e., poisoning, facet, and attachment of etching byproducts, which cause lower process yields and may lower reliability of the semiconductor device.

Accordingly, it would be desirable to provide methods, which overcome these and other shortcomings of the related art.

SUMMARY OF THE INVENTION

In accordance with one embodiment consistent with the principles of the present invention, a method for forming a conductive wire of a semiconductor device, comprises: etching a lower portion of a side wall of a silicon layer pattern based on a difference of etching selectivities between a silicon layer and a lower film; and forming a T-shaped conductive wire based on the silicon layer pattern.

In accordance with another embodiment consistent with the principles of the present invention, a method for forming conductive wires of a semiconductor device comprises: forming a first interlayer insulating film on a semiconductor substrate having a lower metal wire to form a structure; forming a diffusion barrier layer over the structure; forming a sacrificial conductive layer on the diffusion barrier layer; forming a T-shaped sacrificial conductive layer pattern based on a photolithography process, an upper metal wire mask to etch a lower portion of a side wall of the sacrificial conductive layer, and a notching phenomenon; forming a planarized second interlayer insulating film based on exposing the sacrificial conductive layer, and a second interlayer dielectric film filling an under-cut of the T-shaped sacrificial conductive layer pattern; removing the sacrificial conductive layer pattern based on etching an exposed portion of the diffusion barrier layer to simultaneously form a via contact hole and a trench exposing the lower metal wiring; and forming an upper metal wire connected to the lower metal wire by filling the via contact hole and the trench.

It is to be understood that both the foregoing general description and the following detailed description are exemplary and explanatory only and are not restrictive of the invention, as claimed.

BRIEF DESCRIPTION OF THE DRAWINGS

The foregoing and other features of the present invention will become more fully apparent from the following description and appended claims, taken in conjunction with the accompanying drawings. Understanding that these drawings depict only typical embodiments of the invention and are, therefore not to be considered limiting of its scope, the invention will be described with additional specificity and detail through use of the accompanying drawings.

In the Figures.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Conductive wires of a semiconductor device may be formed, for example, to prevent misalignment and improve the device's electric characteristics. Engraved polycrystalline silicon patterns are formed where a via/contact plug and an upper metal wire are located based on a notching phenomenon. The notching phenomenon uses the different etching selectivity between the polycrystalline silicon layer and lower film.

When the etching selectivity ratio between a polycrystalline silicon layer and a lower film is 5:1 to 500:1, a notching phenomenon may occur during the etching process of the polycrystalline silicon layer. The notching phenomenon allows an engraved polycrystalline silicon layer pattern to form on the upper metal wire region where the trench and the via/contact hole are to be located. An interlayer dielectric film may then be formed. The upper portion of the polycrystalline silicon layer pattern is exposed, and the polycrystalline silicon layer pattern is removed. Accordingly, the trench and the via/contact hole may be formed simultaneously without misalignment.

Figure 1A:
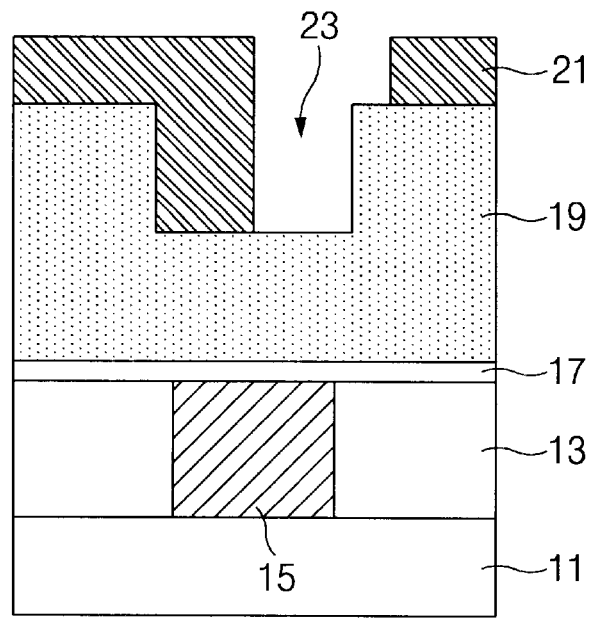
FIG. 1a is a cross sectional view showing a conventional method for forming a conductive wire of a semiconductor, more particularly, a process of forming a via/contact hole after forming a trench in accordance with a first embodiment of the related art.
Figure 1B:
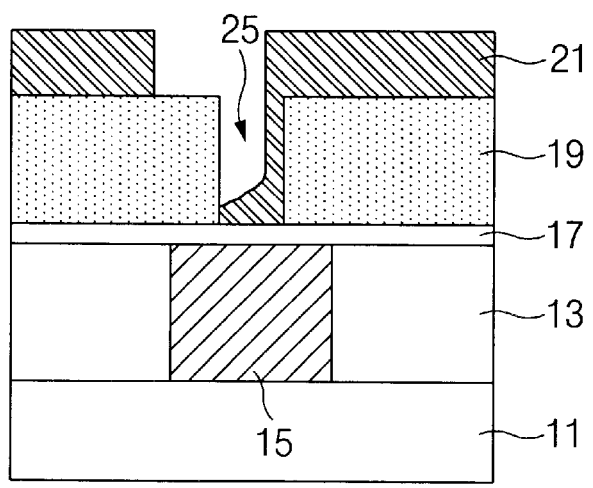
FIG. 1b is a cross sectional view showing a conventional method for forming a conductive wire of a semiconductor, more particularly, a process of forming a via/contact hole after forming a trench in accordance with a second embodiment of the related art.
Figure 2A:
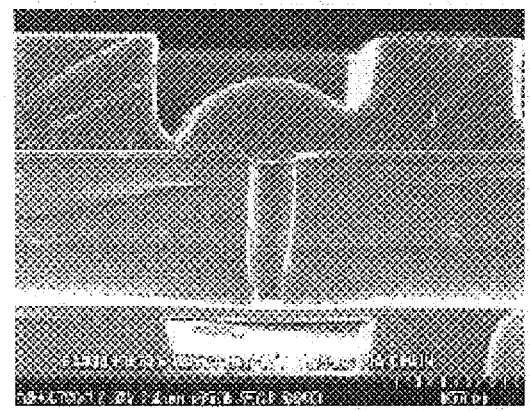
FIGS. 2a through 2c show the problems with the conventional processes for forming conductive wires in semiconductor devices.
Figure 2B:
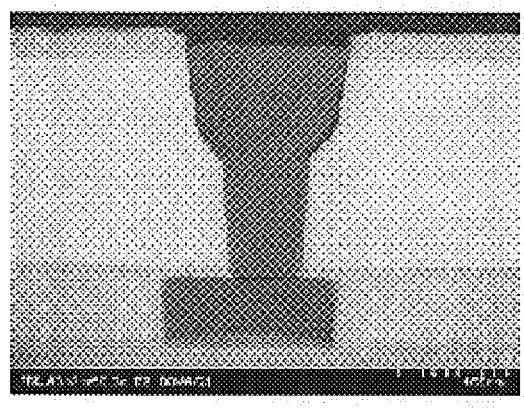
Figure 2C:
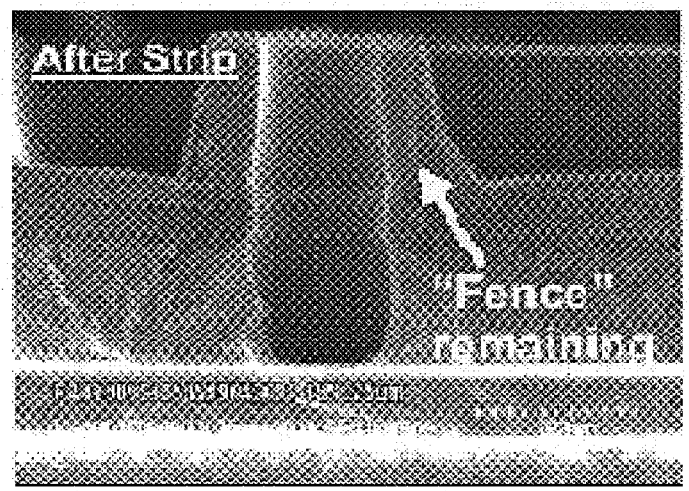
Figure 3A:
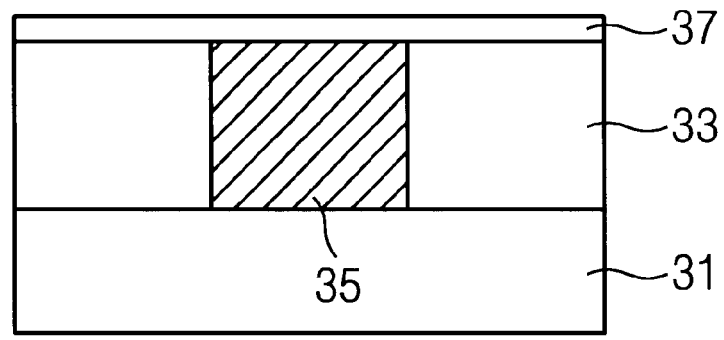
FIGS. 3a through 3f show cross-sectional views illustrating a method for forming conductive wires of a semiconductor device in accordance with embodiments consistent with the principles of the present invention.

FIGS. 3a through 3f show cross-sectional views illustrating a method for forming conductive wires of a semiconductor device in accordance with an embodiment consistent with the principles of the present invention. Referring to FIG. 3a, a first interlayer dielectric film 33 is formed on a semiconductor substrate 31 having a lower structure (not shown) including a word line, a bit line and a capacitor.

The first interlayer dielectric film 33 is then etched using a photolithography process. A lower metal wire mask may be used to expose a portion for a trench for the lower metal wire. A metal layer is then formed on the surface to fill the trench. For example, the metal layer may comprise copper. The metal layer is then planarized using a chemical mechanical polishing ("CMP") process to form lower metal wire 35.

A diffusion barrier layer 37 is formed on the surface having a predetermined thickness. For example, the diffusion barrier layer 37 may comprise a $Si_3N_4$ film or SiC film having an etching selectivity ratio of 5:1 to 500:1 to the etching gas for etching a sacrificial conductive layer 39.

Figure 3B:
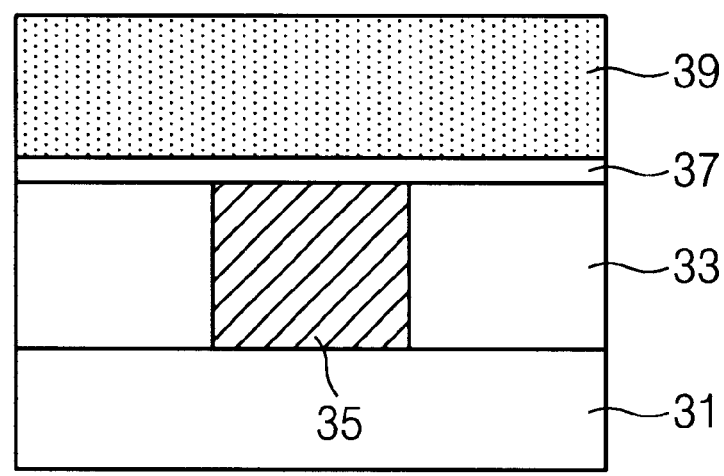

Referring now to FIG. 3b, the sacrificial conductive layer 39 is formed on the diffusion barrier layer layer 37. The sacrificial conductive layer 39 may comprise a silicon layer having a thickness of approximately 5000 to 12000 Å. The sacrificial conductive layer may be formed using a plasma enhanced chemical vapor deposition (PECVD) or chemical vapor deposition (CVD) method at a temperature ranging from approximately 50° C. to 350° C. In one embodiment, the sacrificial conductive layer 39 is an amorphous silicon layer, which does not have a crystalline structure due to a low deposition temperature. Alternatively, the sacrificial conductive layer 39 may be a polycrystalline silicon layer formed by the PECVD or the CVD method at a temperature ranging from approximately 300° C. to 850° C.

Figure 3C:
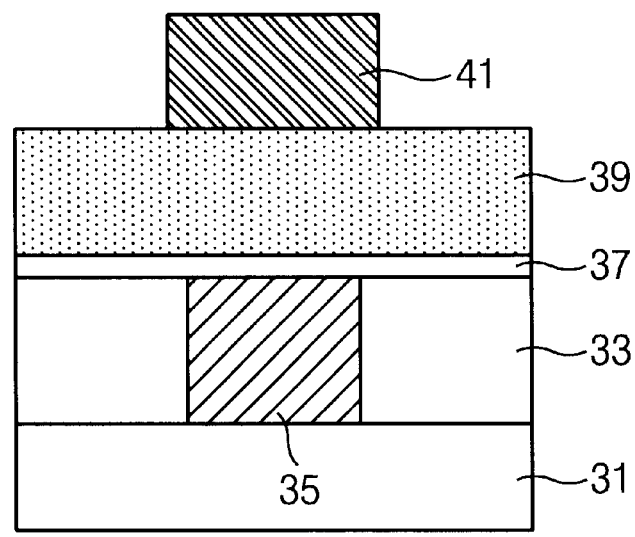

Referring now to FIG. 3c, a photoresist film pattern 41 protects a predetermined portion where an upper metal wire is to be located on the sacrificial conductive layer 39. The photoresist film pattern 41 may be formed by an exposure and developing process using an upper metal wire mask. In one embodiment, the portion where the via/contact hole is to be formed is broader than the part where the upper metal wire only is formed, e.g., to form a shape like a dog bone.

Figure 3D:
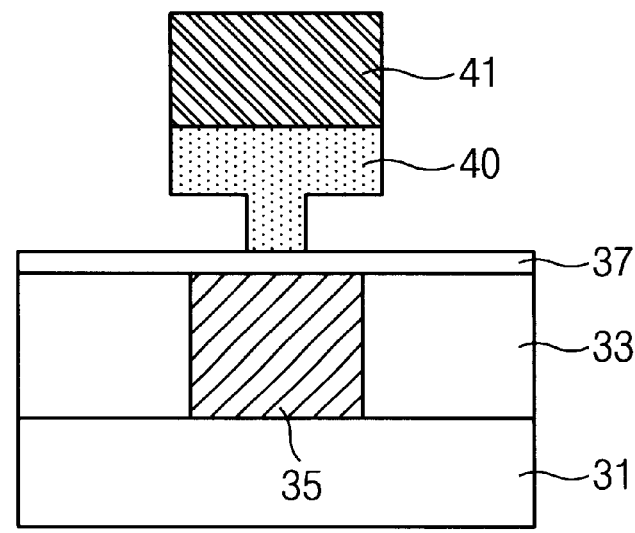

Referring now to FIG. 3d, a sacrificial conductive layer pattern 40 for the upper metal wire and a via/contact plug is formed by etching the sacrificial conductive layer 39 using the photoresist layer pattern 41 as an etching mask. The etching process may be a dry etching process, which uses a halogen as an etching gas, such as $C_xF_y$ gas, $Cl_2$ gas, or HBr gas, and uses plasma diluted gases, such as $N_2$, $O_2$, Ar, He, Ne and Kr, as a supplementary gas.

Since the difference in the etching selectivity between the sacrificial conductive layer 39 and the diffusion barrier layer under the sacrificial conductive layer 39 is greater than 10:1, a lower portion of a side wall of the sacrificial conductive layer 39 may be etched by a radical produced by the etching gas, such as a radical of Cl or Br. The etching of the lower portion of the side wall of the sacrificial conductive layer 39 causes a notching phenomenon and results in the formation of a T-shaped sacrificial conductive layer pattern 40 having an under-cut.

Figure 3E:
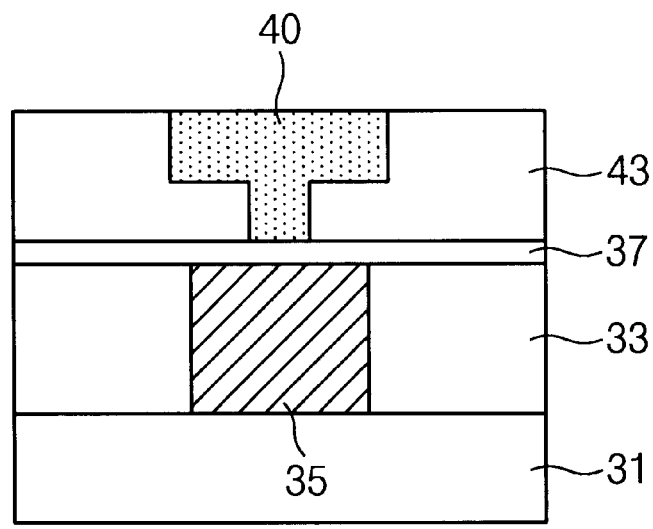

Referring to now FIG. 3e, the photoresist film pattern 41 is removed and cleaned. The photoresist film pattern 41 may be removed by a dry etching process using a mixture of $O_2$ gas and $C_xF_y$ gas. The side wall polymer from the previous process may also be removed when the photoresist film pattern 41 is removed.

A second interlayer dielectric film 43 is then formed on the surface of diffusion barrier 37. The second interlayer dielectric film 43 may comprise organic chemical materials having a low viscosity and dielectric coefficient as well as other materials containing hydrogen or fluorine, such as HSQ (hydrogen silsesquioxane), or Fox (flowable oxide). In addition, the under-cut of the T-shaped sacrificial conductive layer pattern 40 may be completely filled. The second interlayer dielectric film 43 is then planarized to expose the sacrificial conductive layer pattern 40.

Figure 3F:
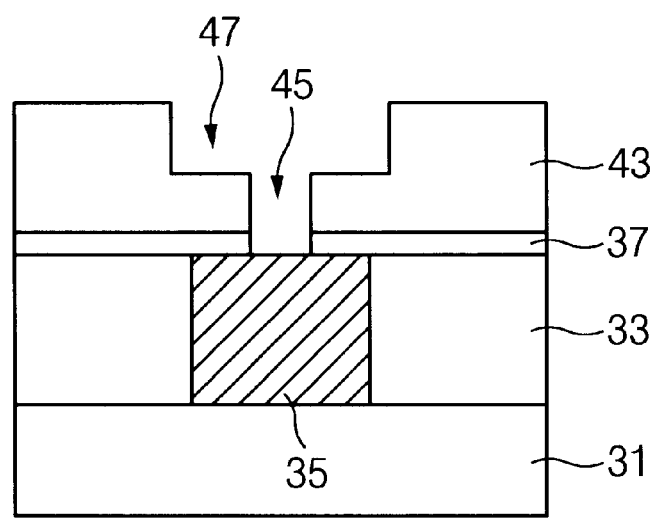

Referring now to FIG. 3f, a via contact hole 45 and a trench 47 are formed to expose the lower metal wire 35 by removing the exposed sacrificial conductive layer pattern 40 and a portion of diffusion barrier layer 37. The sacrificial conductive layer pattern 40 and the portion of diffusion barrier layer 37 may be removed using a dry etching process using $C_xF_y$ gas, $Cl_2$ gas or HBr gas having an etching selectivity difference compared to the second interlayer dielectric film 43. Alternatively, a wet etching process using acetic acid or nitric acid may be used. The etching process may be performed using pressures ranging from approximately 0.5 mtorr to 1500 mtorr, a power source ranging from 50W to 3000W, and an applied bias power ranging from 0W to 200W. In addition, gas containing a halogen, such as F, Cl, or Br, may be used as an etching gas and an inactive gas may be used as a supplementary gas. Accordingly, the conductive wires may be formed utilizing the notching phenomenon, for example, caused by the difference in the etching selectivity of 10:1 or greater between a polysilicon layer and a lower film.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming conductive wires of a semiconductor device, comprising the steps of:

forming a first interlayer insulating film on a semiconductor substrate having a lower metal wire to form a structure;

forming a diffusion barrier layer over the structure;

forming a sacrificial conductive layer on the diffusion barrier layer;

forming a T-shaped sacrificial conductive layer pattern based on a photolithography process using an upper metal wire mask to etch a lower portion of a side wall of the sacrificial conductive layer by utilizing a notching phenomenon;

forming a planarized second interlayer insulating film over the structure to expose the T-shaped sacrificial conductive layer pattern, the second interlayer insulating film filling an under-cut of the T-shaped sacrificial conductive layer pattern;

removing the T-shaped sacrificial conductive layer pattern by etching an exposed portion of the diffusion barrier layer to simultaneously form a via contact hole and a trench exposing the lower metal wire, and forming an upper metal wire connected to the lower metal wire by filling the via contact hole and the trench.

2. The method of claim 1, wherein the sacrificial conductive layer comprises silicon.

3. The method of claim 1, wherein the sacrificial conductive layer comprises an amorphous silicon layer having a thickness of 5000 to 12000 Å formed by a chemical vapor deposition process at a temperature ranging from 50 to 350° C.

4. The method of claim 1, wherein the sacrificial conductive layer comprises a polysilicon layer having a thickness of 5000 to 12000 Å formed by a chemical vapor deposition process at a temperature ranging from 300 to 850° C.

5. The method of claim 1, wherein a ratio of etching selectivity of the diffusion barrier layer to that of the sacrificial conductive layer is approximately 1:5 to 500.

6. The method of claim 5, wherein the diffusion barrier layer comprises at least one of $Si_3N_4$ and SiC, and wherein the sacrificial conductive layer comprises at least one of amorphous silicon and low temperature polysilicon, formed by a chemical vapor deposition process.

7. The method of claim 1, wherein the etching process of the sacrificial conductive layer is a dry etching process using an etching gas comprising a halogen, and a supplementary etching gas selected from a group consisting of $N_2$, $O_2$, Ar, He, Ne, and Kr.

8. The method of claim 7, wherein the etching gas is selected from a group consisting of $C_xF_y$ gas, $Cl_2$ gas, and HBr gas.

9. The method of claim 1, wherein the second interlayer insulating film comprises at least one of an oxide film comprising hydrogen or fluorine, and an organic chemical material with a low viscosity and dielectric coefficient.

10. The method of claim 1, wherein the step of removing the sacrificial conductive layer pattern is a dry etching process based on a different etching selectivity between the sacrificial conductive layer pattern and the second interlayer dielectric film.

11. The method of claim 10, wherein the dry etching process uses a gas selected from a group consisting of $C_xF_y$ gas, $Cl_2$ gas, and HBr.

12. The method of claim 1, wherein the step of removing the sacrificial conductive layer pattern is a wet etching process using acetic acid or nitric acid, and is based on a different etching selectivity between the sacrificial conductive layer pattern and the second interlayer dielectric film.

* * * * *